United States Patent
Satoh et al.

(10) Patent No.: US 8,378,331 B2
(45) Date of Patent: Feb. 19, 2013

(54) NONVOLATILE SEMICONDUCTOR MEMORY DEVICE

(75) Inventors: Yasuhiro Satoh, Yokohama (JP); Tsukasa Nakai, Hino (JP); Kazuhiko Yamamoto, Yokohama (JP); Motoya Kishida, Yokohama (JP); Hiroyuki Fukumizu, Yokohama (JP); Yasuhiro Nojiri, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 419 days.

(21) Appl. No.: 12/707,136

(22) Filed: Feb. 17, 2010

(65) Prior Publication Data

US 2010/0237319 A1 Sep. 23, 2010

(30) Foreign Application Priority Data

Mar. 23, 2009 (JP) .................................. 2009-071024

(51) Int. Cl.
*H01L 29/02* (2006.01)
(52) U.S. Cl. .................................. 257/2; 257/5; 257/314
(58) Field of Classification Search .................. 257/2, 5, 257/314
See application file for complete search history.

(56) References Cited

U.S. PATENT DOCUMENTS

2007/0148862 A1* 6/2007 Chen et al. .................... 438/257
2009/0237987 A1* 9/2009 Zhu et al. ....................... 365/171

FOREIGN PATENT DOCUMENTS

JP 2005-522045 7/2005

OTHER PUBLICATIONS

U.S. Appl. No. 12/545,326, filed Aug. 21, 2009, Kazuhiko Yamamoto et al.
U.S. Appl. No. 12/882,822, filed Sep. 15, 2010, Nakai, et al.
U.S. Appl. No. 13/043,923, filed Mar. 9, 2011, Kobayashi, et al.

* cited by examiner

*Primary Examiner* — Jae Lee
(74) *Attorney, Agent, or Firm* — Oblon, Spivak, McClelland, Maier & Neustadt, L.L.P.

(57) ABSTRACT

This nonvolatile semiconductor memory device comprises a memory cell array including memory cells arranged therein. Each of the memory cells is located at respective intersections between first wirings and second wirings and includes a variable resistance element. The variable resistance element comprises a thin film including carbon (C). The thin film includes a side surface along a direction of a current flowing in the memory cell. The side surface includes carbon nitride ($CN_x$).

17 Claims, 10 Drawing Sheets

⇓ Asher

⇓ HEAT PROCESS

(PRIOR ART)

(EMBODIMENT)

FIG. 12

| EXAMPLES | AMOUNT OF N x | Vset [V] | Vreset [V] | $R_{on}$ [Ω] | $R_{off}$ [Ω] | $R_{ratio}$ | REPEAT |
|---|---|---|---|---|---|---|---|
| 1 | 0.15 | 2.2 | 0.8 | $4 \cdot 10^3$ | $5 \cdot 10^8$ | $1 \cdot 10^5$ | $>=10^6$ |
| 2 | 0.2 | 2.5 | 0.9 | $6 \cdot 10^3$ | $9 \cdot 10^8$ | $1 \cdot 10^5$ | $>=10^6$ |
| 3 | 0.3 | 2.9 | 1.3 | $8 \cdot 10^3$ | $9 \cdot 10^8$ | $1 \cdot 10^5$ | $>=10^6$ |
| 4 | 0.5 | 3.3 | 1.5 | $8 \cdot 10^3$ | $1 \cdot 10^9$ | $1 \cdot 10^5$ | $>=10^6$ |
| 5 | 0.8 | 3.6 | 1.8 | $9 \cdot 10^3$ | $2 \cdot 10^9$ | $2 \cdot 10^5$ | $>=10^6$ |
| 6 | 1 | 3.7 | 2.1 | $1 \cdot 10^4$ | $5 \cdot 10^9$ | $5 \cdot 10^5$ | $>=10^6$ |
| COMPARATIVE EXAMPLE | AMOUNT OF Ni x | Vset [V] | Vreset [V] | $R_{on}$ [Ω] | $R_{off}$ [Ω] | $R_{ratio}$ | REPEAT |
| 1 | 0.1 | 9.2 | 8.9 | $1 \cdot 10^2$ | $1 \cdot 10^1$ | $10^2$ | $10^2$ |
| 2 | 1.5 | NO CHANGE IN RESISTANCE | | | | | |

FIG. 13

| EXAMPLES | RESISTIVITY [Ω m] | Vset [V] | Vreset [V] | $R_{on}$ [Ω] | $R_{off}$ [Ω] | $R_{ratio}$ | REPEAT |
|---|---|---|---|---|---|---|---|
| 7 | $1 \cdot 10^8$ | 2.2 | 0.8 | $5 \cdot 10^3$ | $7 \cdot 10^8$ | $1 \cdot 10^5$ | $>=10^6$ |
| 8 | $3 \cdot 10^{10}$ | 2.5 | 0.9 | $6 \cdot 10^3$ | $2 \cdot 10^9$ | $3 \cdot 10^5$ | $>=10^6$ |
| 9 | $8 \cdot 10^{14}$ | 2.9 | 1.3 | $8 \cdot 10^3$ | $9 \cdot 10^8$ | $1 \cdot 10^5$ | $>=10^6$ |
| COMPARATIVE EXAMPLE | RESISTIVITY [Ω cm] | Vset [V] | Vreset [V] | $R_{on}$ [Ω] | $R_{off}$ [Ω] | $R_{ratio}$ | REPEAT |
| 3 | $3 \cdot 10^{-2}$ | 11.2 | 9.2 | $1 \cdot 10^2$ | $2 \cdot 10^3$ | $2 \cdot 10^1$ | 10 |
| 4 | $4 \cdot 10^5$ | 9.8 | 8.9 | $3 \cdot 10^2$ | $4 \cdot 10^1$ | $1 \cdot 10^2$ | $10^2$ |

FIG. 14

| EXAMPLES | HYDROGEN CONTENT RATE[at.%] | Vset [V] | Vreset [V] | $R_{on}$ [Ω] | $R_{off}$ [Ω] | $R_{ratio}$ | NUMBER OF REPEAT |
|---|---|---|---|---|---|---|---|
| 10 | 0.1 | 2.2 | 0.8 | $8 \cdot 10^3$ | $9 \cdot 10^8$ | $1 \cdot 10^5$ | $>=10^6$ |
| 11 | 5 | 2.5 | 0.9 | $6 \cdot 10^3$ | $7 \cdot 10^8$ | $1 \cdot 10^5$ | $>=10^6$ |
| 12 | 40 | 2.9 | 1.3 | $3 \cdot 10^3$ | $6 \cdot 10^8$ | $2 \cdot 10^5$ | $>=10^6$ |
| 13 | 70 | 3.3 | 1.5 | $2 \cdot 10^3$ | $5 \cdot 10^8$ | $3 \cdot 10^5$ | $>=10^6$ |
| COMPARATIVE EXAMPLE | HYDROGEN CONTENT RATE[at.%] | Vset [V] | Vreset [V] | $R_{on}$ [Ω] | $R_{off}$ [Ω] | $R_{ratio}$ | NUMBER OF REPEAT |
| 5 | 80 | 4.2 | 2.2 | $2 \cdot 10^2$ | $5 \cdot 10^3$ | $3 \cdot 10^1$ | $10^2$ |

FIG. 15

| EXAMPLES | MIXTURE | Vset [V] | Vreset [V] | $R_{on}$ [Ω] | $R_{off}$ [Ω] | $R_{ratio}$ | NUMBER OF REPEAT |
|---|---|---|---|---|---|---|---|
| 14 | SiO2 | 2.5 | 0.8 | $8 \cdot 10^3$ | $9 \cdot 10^8$ | $1 \cdot 10^5$ | $>=10^6$ |
| 15 | SiN | 2.8 | 0.9 | $6 \cdot 10^3$ | $7 \cdot 10^8$ | $1 \cdot 10^5$ | $>=10^6$ |
| 16 | AlN | 2.2 | 0.8 | $8 \cdot 10^3$ | $9 \cdot 10^8$ | $1 \cdot 10^5$ | $>=10^6$ |
| 17 | Al2O3 | 2.6 | 1.0 | $6 \cdot 10^3$ | $7 \cdot 10^8$ | $1 \cdot 10^5$ | $>=10^6$ |
| 18 | BN | 2.9 | 0.9 | $3 \cdot 10^3$ | $6 \cdot 10^8$ | $2 \cdot 10^5$ | $>=10^6$ |
| 19 | B | 2.4 | 1.0 | $2 \cdot 10^3$ | $5 \cdot 10^8$ | $3 \cdot 10^5$ | $>=10^6$ |

NONVOLATILE SEMICONDUCTOR MEMORY DEVICE

CROSS-REFERENCE TO RELATED APPLICATION

This application is based on and claims the benefit of priority from prior Japanese Patent Application No. 2009-71024, filed on Mar. 23, 2009, the entire contents of which are incorporated herein by reference.

BACKGROUND OF THE INVENTION

1. Field of the Invention

The present invention relates to a nonvolatile semiconductor memory device, more specifically to a nonvolatile semiconductor memory device including memory cells arranged therein, each of which comprises a variable resistance element and stores data based on variation in resistance value of the variable resistance element.

2. Description of the Related Art

In recent years, along with a rising level of integration in semiconductor devices, circuit patterns of transistors and the like which configure the semiconductor devices are being increasingly miniaturized. Required in this miniaturization of the patterns is not simply a thinning of line width but also an improvement in dimensional accuracy and positional accuracy of the patterns. This trend applies also to semiconductor memory devices.

Conventionally known and marketed semiconductor memory devices such as DRAM, SRAM, and flash memory each use a MOSFET as a memory cell. Consequently, there is required, accompanying the miniaturization of patterns, an improvement in dimensional accuracy at a rate exceeding a rate of the miniaturization. As a result, a large burden is placed also on the lithography technology for forming these patterns which is a factor contributing to a rise in product cost.

In recent years, resistive memory is attracting attention as a candidate to succeed these kinds of semiconductor memory devices utilizing a MOSFET as a memory cell (refer, for example, to Japanese Unexamined Patent Application Publication (Translation of POT Application) No. 2005-522045). Since such the resistive memory may adopt a crosspoint-type structure in which memory cells are formed at intersections of crossing bit lines and word lines, it is easy to be miniaturized in comparison to conventional memory cells. In addition, since it may adopt a lamination structure in a stacking direction, it is easy to improve the integration of the memory cell array.

It is known that the variable resistance elements in resistive memory have two modes of operation. One is to set a high resistance state and a low resistance state by switching the polarity of the applied voltage, which is referred to as "bipolar type". The other enables the setting of a high resistance state and a low resistance state by controlling the voltage values and the voltage application time, without switching the polarity of the applied voltage, which is referred to as "unipolar type".

Data write to the memory cell is performed by applying a certain voltage to the variable resistance element for a short time. This allows the variable resistance memory cell to change from a high resistance state to a low resistance state. Such the operation for changing the variable resistance element from a high resistance state to a low resistance state is called "a set operation".

On the other hand, data erase of the memory cell is performed by applying a certain voltage that is smaller than that in the setting operation, to the variable resistance element having a low resistance state after the setting operation, for a longer time. This allows the variable resistance memory cell to change from a low resistance state to a high resistance state. Such the operation for changing the variable resistance element from a low resistance state to a high resistance state is called "a reset operation". The memory cell is in a stable state in the high resistance state (the reset state), for example. If the memory cell stores 2-value data, data write thereto is performed by a setting operation that changes the reset state to a low resistance state.

A transition metal oxide is known as a material for the variable resistance element in the resistive memory. The transition metal oxide, however, in general, has difficulty in controlling composition of the film. As a result, it is difficult to avoid deterioration or variation in resistance variation characteristics.

On the other hand, a thin film of carbon is drawing attention as a material for the variable resistance element for resistive memory. This carbon thin film has difficulty in processing. Specifically, the carbon thin film tends to suffer a side etching at the time of etching process thereof. Since the carbon thin film easily reacts with etching gas, electric characteristics of the element after the process sometimes are greatly lowered or become worse. Accordingly, stable electric characteristics of the memory cell cannot be ensured with ease. In addition, carbon has a high electric resistivity, and requires a large current at its operation, thus leading to increase in power consumption.

SUMMARY OF THE INVENTION

In accordance with an aspect of the present invention, a nonvolatile semiconductor memory device is provided. The nonvolatile semiconductor memory device comprises a memory cell array including memory cells arranged therein, each of the memory cells being located at respective intersections between first wirings and second wirings and including a variable resistance element. The variable resistance element comprises a thin film including carbon (C). The thin film includes a side surface along a direction of a current flowing in the memory cell, and the side surface includes carbon nitride ($CN_x$).

DETAILED DESCRIPTION OF THE EMBODIMENTS

The embodiments of the invention will now be described in detail with reference to the drawings.

[Entire Configuration]

Figure 1:
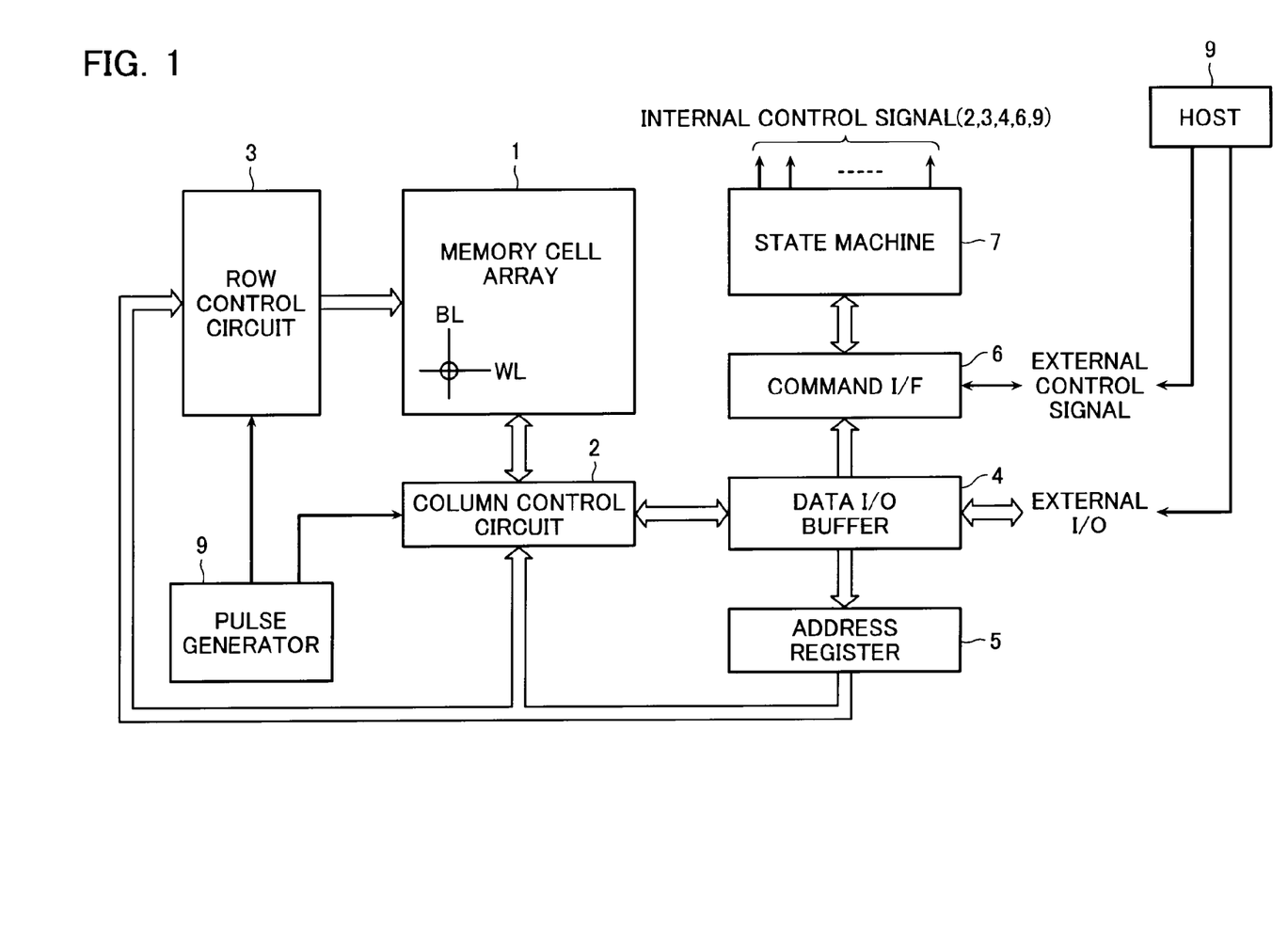
FIG. 1 is a block diagram of a nonvolatile semiconductor memory device in accordance with an embodiment of the present invention.

FIG. 1 is a block diagram of a nonvolatile memory in accordance with the embodiment of the present invention.

The non-volatile memory includes a memory cell array 1 including a memory cells with ReRAM (variable resistive elements) described later arranged therein in a matrix form.

A column control circuit 2 is provided at a position adjacent to the memory cell array 1 in the bit line BL direction. It controls the bit line BL in the memory cell array 1 to erase data from the memory cell, write data in the memory cell, and read data out of the memory cell.

A row control circuit 3 is provided at a position adjacent to the memory cell array 1 in the word line WL direction. It selects the word line WL in the memory cell array 1 and applies voltages required to erase data from the memory cell, write data in the memory cell, and read data out of the memory cell.

The data I/O buffer 4 is connected to an external host 9 via an I/O line to receive write data, receive erase instructions, provide read data, and receive address data and command data. The data I/O buffer 4 sends received write data to the column control circuit 2 and receives read-out data from the column control circuit 2 and provides it to external.

An address fed from external to the data I/O buffer 4 is sent via the address register 5 to the column control circuit 2 and the row control circuit 3.

A command fed from the host 9 to the data I/O buffer 4 is sent to the command interface 6. The command interface 6 receives an external control signal from the host 9 and decides whether the data fed to the data I/O buffer 4 is write data, a command or an address. If it is a command, then the command interface 6 transfers it as a received command signal to the state machine 7.

The state machine 7 manages the entire nonvolatile memory to receive commands from the host 9 to execute read, write, erase, and execute data I/O management. The external host 9 can also receive status information managed by the state machine 7 and decides the operation result. The status information is also utilized in control of write and erase.

The state machine 7 controls the pulse generator 9. Under this control, the pulse generator 9 is allowed to provide a pulse of any voltage at any timing. The pulse formed herein can be transferred to any line selected by the column control circuit 2 and the row control circuit 3. Peripheral circuit elements other than the memory cell array 1 can be formed in a Si substrate immediately beneath the memory cell array 1 formed in a wiring layer. Thus, the chip area of the nonvolatile memory can be made almost equal to the area of the memory cell array 1.

[Memory Cell Array and Peripheral Circuit]

Figure 2:
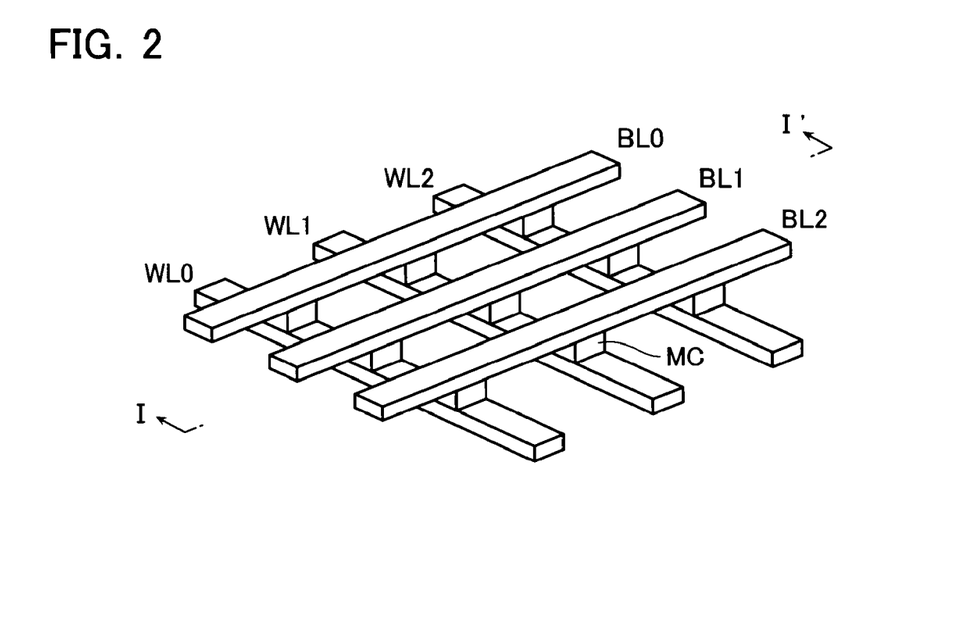
FIG. 2 is a perspective view of a part of the memory cell array 1.
Figure 3:
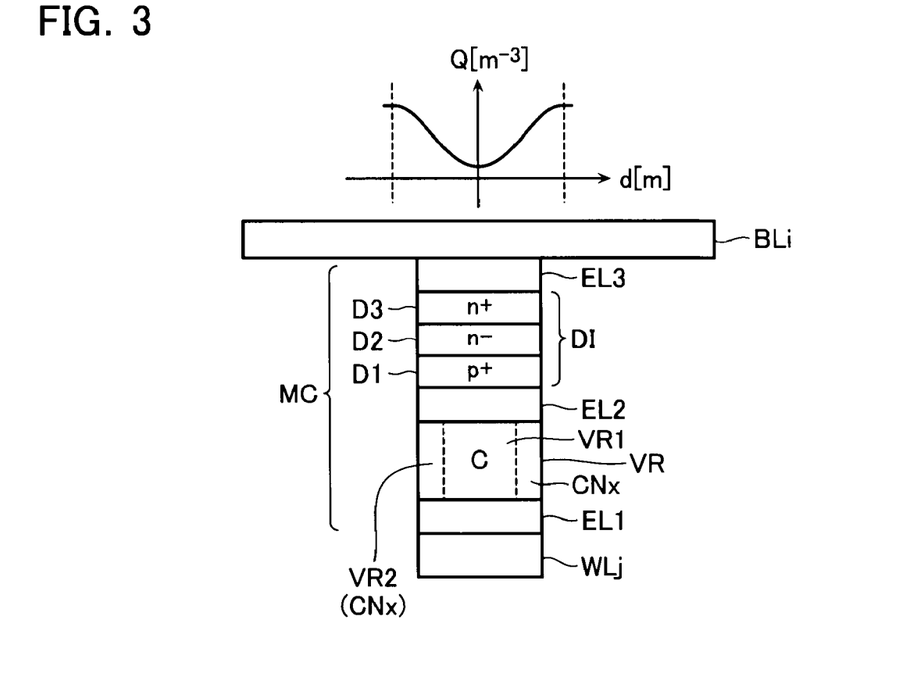
FIG. 3 is a cross-sectional view of one memory cell taken along the line I-I' and seen from the direction of the arrow in FIG. 2.

FIG. 2 is a perspective view of a part of the memory cell array 1. FIG. 3 is a cross-sectional view of one memory cell taken along the line I-I' and seen from the direction of the arrow in FIG. 2.

Word lines WL (WL0~WL2) as a plurality of first wiring layers are arranged in parallel, and bit lines BL (BL0~BL2) as a plurality of second wiring layers are arranged in parallel and intersecting with the word lines WL. Memory cells MC are arranged to be sandwiched by the word lines and the bit lines at intersections therebetween. The first and second wiring layers are preferably made from a material with good heat resistance and a low resistance, for example, tungsten (W), tungsten silicide (WSi), nickel silicide (NiSi), cobalt silicide (CoSi), or the like.

[Memory Cell MC]

The Memory cell MC comprises a series-connected circuit including a variable resistor VR and a diode DI as shown in FIG. 3. As shown in FIG. 3, the diode DI is a PIN diode comprising a p+ type layer D1, an n-type layer D2 and an n+ type layer D3. Here, the reference signs of "+" and "−" indicate a magnitude of impurity concentration, respectively. The variable resistance element VR is composed of a thin film of carbon (C). A principal ingredient in a center portion VR1 of the variable resistance element VR (the side portion VR2 is along a direction of a current in the memory cell MC) is carbon (C). On the other hand, a side portion VR2 of the variable resistance element VR (the side portion VR2 is along a direction of a current in the memory cell MC) is mainly composed of a thin film of carbon nitride (CNx). A content rate of nitrogen at the side portion VR2 may be expressed by a value of x, which is a value of a content rate of nitrogen [at. %] divided by a content rate of carbon [at. %]. The value of x is preferably not less than 0.15. More preferably, the value of x is 1 not less than 0.2 and not more than 1.

When x becomes less than 0.15, an etching-resistance property becomes poor. In addition, when a resistance of the side portion VR2 becomes low, a large current becomes necessary for an operation. More preferably, a content rate rate Q of carbon nitride ($CN_x$) continuously and monotonically increases from the center portion VR1 of the variable resistance element VR (a carbon thin film) to the side portion VR2 (see a graph of FIG. 3).

Carbon nitride ($CN_x$) forms an insulator. In the variable resistance element VR, a content rate Q of carbon nitride (CNx) becomes the highest at the side portion VR2 (for example, a first value q1) and becomes smaller as it goes closer to the center portion VR1 (for example, the content rate Q becomes the Q=q2 (<q1) at the lowest portion).

Accordingly, the variable resistance element VR has, at the center portion VR1, a resistivity r1 that is not more than $10^{-4}$ [Ωm], for example. On the other hand, it has a resistivity r2 that is much higher than the resistivity r1 at the side portion VR2. It is preferable that the resistivity r2 of the side portion VR2 is $10^8$[Ωm] or more. It is preferable that the formation of carbon (C) in the variable resistance element VR is any one of diamond, diamond-like carbon (DLC), graphite (amorphous carbon), and carbon nanotube (CNT). Moreover, it may be formed of a carbon nanotube (CNT) in which carbon nitride ($CN_x$) is dispersed.

Note that hydrogen (H) may be included in the variable resistance element VR in addition to carbon (C) and nitrogen (N). The content rate of hydrogen is preferably not less than 0.1 [at. %] and not more than 70 [at. %]. More preferably, it may be not less than 5 [at. %] and not more than 40 [at. %]. Moreover, it may be a mixture including insulators such as $SiO_2$, $SiN_x$, $AlN_x$, $Al_2O_3$, B, and BN.

Note that identification and quantitative determination of carbon (C), nitrogen (N) and the like in the variable resistance element VR can be performed by XPS (X-ray photoelectron spectroscopy), ICP analysis (Inductively-Coupled Plasma analysis), SIMS (Secondary Ionization Mass Spectrometer), EDX (Energy Dispersive X-ray Fluorescence Spectrometer), and the like.

As material of the electrode EL1 to EL3, Pt, Au, Ag, TiAlN, SrRuO, Ru, RuN, Ir, Co, Ti, TiN, TaN, LaNiO, Al, PtIrOx, PtRhOx, Rh/TaAlN, W may be used. Moreover, it is also possible to insert therein a metal film that may equalize orientation characteristics of the materials. Moreover, a buffer layer, a barrier metal layer, an adhesive layer or the like may be additionally inserted.

[Modified Example of Memory Cell Array]

Figure 4:
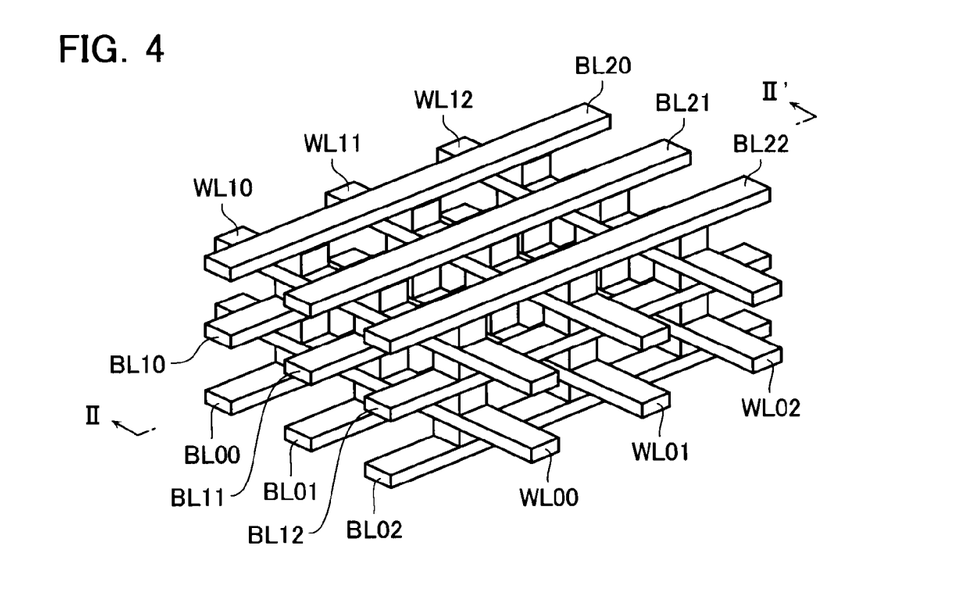
FIG. 4 illustrates another example of the structure of the memory cell array.
Figure 5:
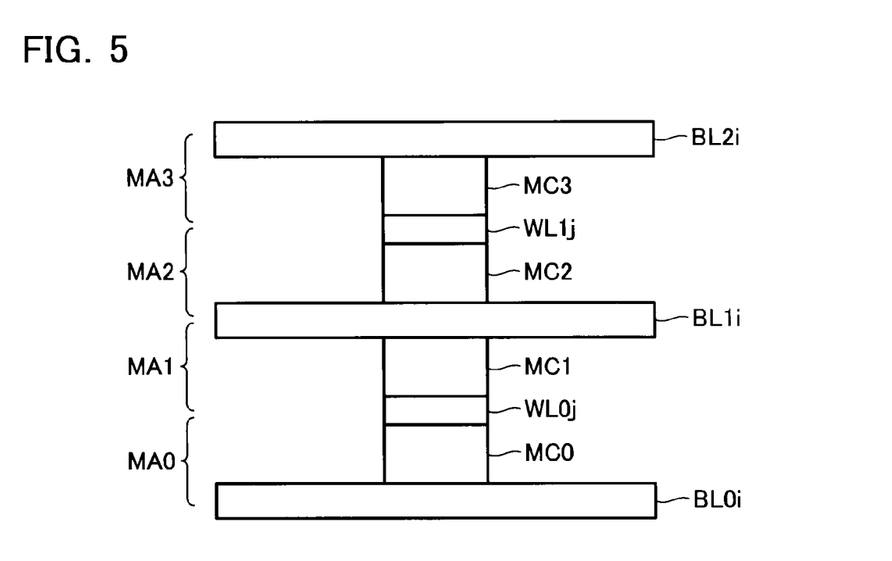
FIG. 5 illustrates another example of the structure of the memory cell array.

Plural such memory structures described above may be stacked to form a three-dimensional structure as shown in FIG. 4. FIG. 5 is a cross-sectional view showing an II-II' section in FIG. 4. The shown example relates to a memory cell array of a 4-layer structure having cell array layers MA0-MA3. A word line WL0$j$ is shared by upper and lower memory cells MC0, MC1. A bit line BL1$i$ is shared by upper and lower memory cells MC1, MC2. A word line WL1$j$ is shared by upper and lower memory cells MC2, MC3.

In place of the line/cell/line/cell repetition, an interlayer insulator may be interposed as a line/cell/line/interlayer-insulator/line/cell/line between cell array layers.

The memory cell array 1 may be divided into MATs of several memory cell groups. The column control circuit 2 and the row control circuit 3 described above may be provided on a MAT-basis, a sector-basis, or a cell array layer MA-basis or shared by them. Alternatively, they may be shared by plural bit lines BL to reduce the area.

Figure 6:
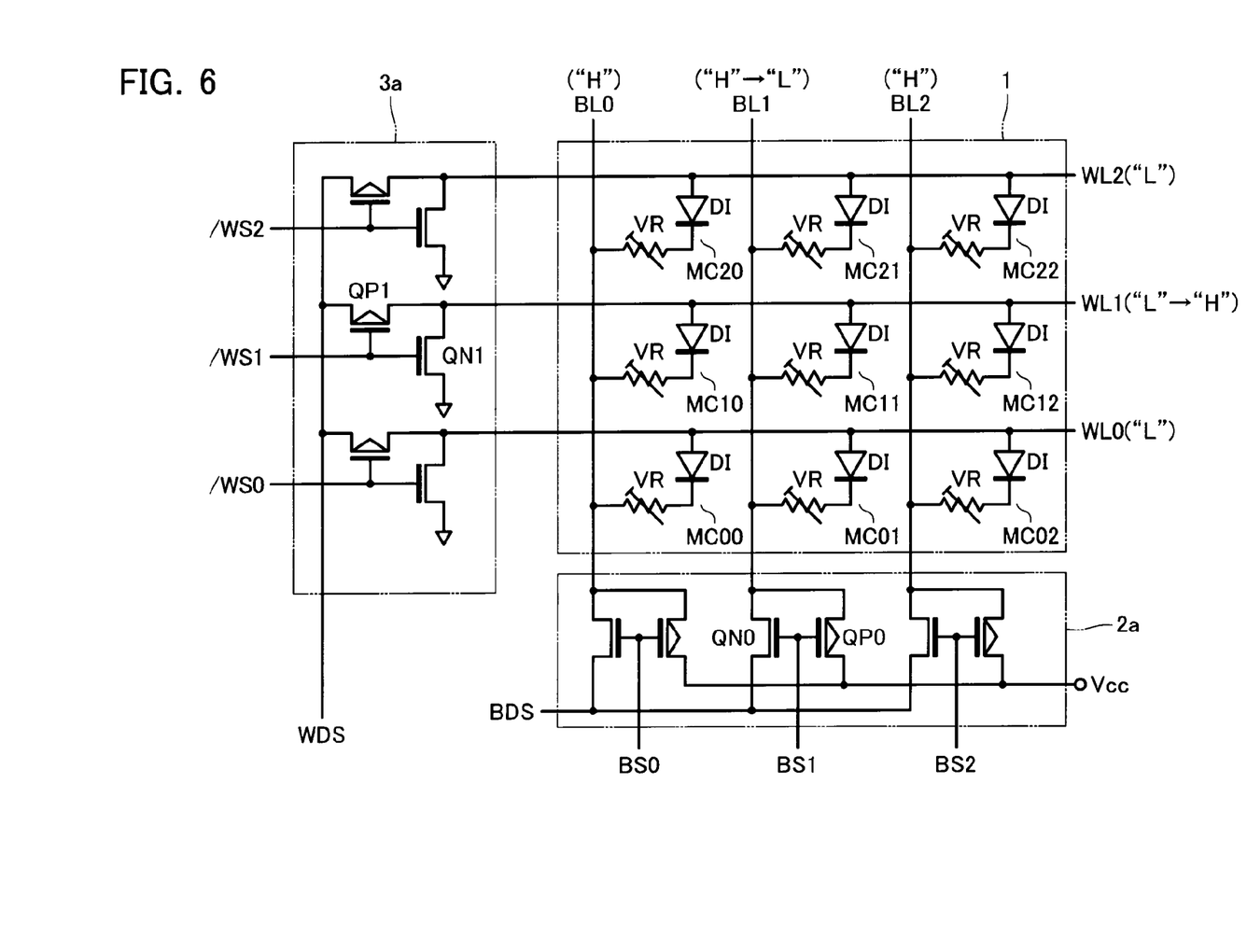
FIG. 6 illustrates a circuit diagram of the memory cell array 1 and the peripheral circuit.

FIG. 6 is a circuit diagram of the memory cell array 1 and peripheral circuits thereof. For simplicity of explanation and easy understanding, the description advances on the assumption that the memory has a single-layered structure. In FIG. 6, the diode contained in the memory cell MC has an anode connected to the word line WL and a cathode connected to the bit line BL via the variable resistor VR. Each bit line BL has one end connected to a selection circuit 2$a$, which is part of the column control circuit 2. Each word line WL has one end connected to a selection circuit 3$a$, which is part of the row control circuit 3.

The selection circuit 2$a$ includes a selection PMOS transistor QP0 and a selection NMOS transistor QN0, provided at each bit line BL, of which gates and drains are commonly connected. The selection PMOS transistor QP0 has a source connected to a high potential source Vcc. The selection NMOS transistor QN0 has a source connected to a bit-line side drive sense line BDS, which is used to apply a write pulse and supply a detection current at the time of data read. The transistors QP0, QN0 have a common drain connected to the bit line BL, and a common gate supplied with a bit-line selection signal BSi for selecting each bit line BL.

The selection circuit 3$a$ includes a selection PMOS transistor QP1 and a selection NMOS transistor QN1, provided at each word line WL, of which gates and drains are commonly connected. The selection PMOS transistor QP1 has a source connected to a word-line side drive sense line WDS, which is used to apply a write pulse and supply a detection current at the time of data read. The selection NMOS transistor QN1 has a source connected to the low potential source Vss. The transistors QP1, QN1 have a common drain connected to the word line WL and a common gate supplied with a word-line selection signal /WSi for selecting each word line WL.

The example shown above is suitable for selecting the memory cells individually. In contrast, in batch read of data from plural memory cells MC connected to the word line WL1, sense amplifiers are arranged individually for the bit lines BL0-BL2, and the bit lines BL0-BL2 are connected to the sense amplifiers individually via the selection circuit 2$a$. Alternatively, the memory cell array 1 may be configured so that the polarity of the diode Di is reversed with respect to the circuit shown in FIG. 6, and a current flows from the bit line BL to the word line WL.

[Variable Resistance Element VR]

Next, the variable resistance element VR is explained in detail with reference to FIG. 7 to FIG. 11. As described in FIG. 3, the variable resistance element VR according to this embodiment includes a thin film of carbon (C). The center portion VR1 thereof is mainly composed of carbon (C), while the side portion VR2 thereof is composed of a carbon nitride (CNx).

Figure 7:
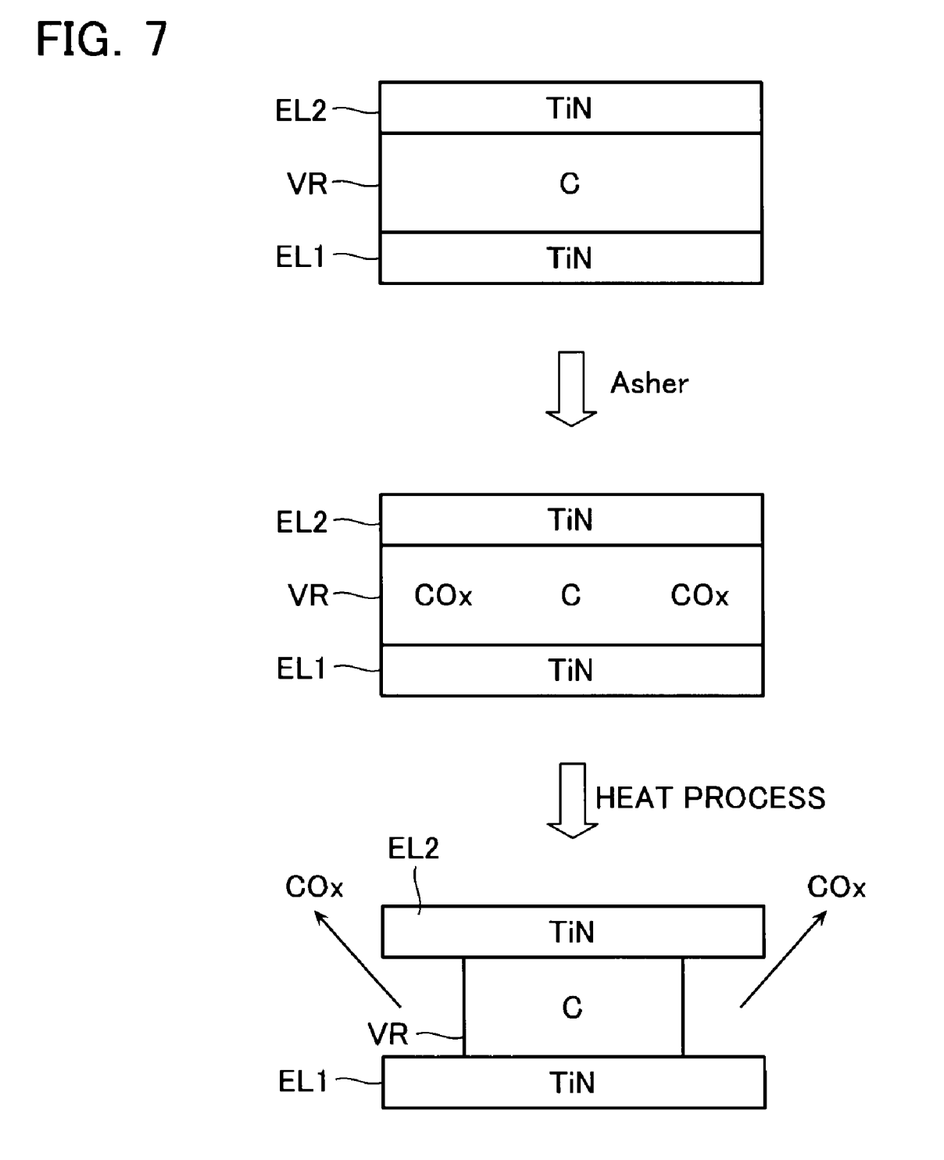
FIG. 7 illustrates a problem when a carbon thin film is used as a variable resistance element VR.

An advantage of the sidewall film of the carbon nitride (CNx) is described with reference to FIG. 7. FIG. 7 illustrates a problem when a sidewall film of such a carbon nitride (CNx) is not formed. After processing memory cells each having a variable resistance element formed of a carbon thin film by reactive ion etching (RIE), it is necessary to perform ashing with oxygen plasma to remove a resist used for the etching. In this case, a side surface of the variable resistance element VR comprising a carbon thin film is damaged by this oxygen plasma. For example, a side surface of the carbon thin film is oxidized, and it changes into carbon monoxide or carbon dioxide (COx), and is vaporized. This might deteriorates the shape of the carbon thin film, making it difficult to obtain a variable resistance element having a stable electric characteristic. A variable resistance element that is deteriorated in shape in this way requires a higher voltage in a set operation or in a reset operation in comparison with a case without shape deterioration.

Moreover, as a result of experiments conducted by the inventors, it has been found that a variable resistance element deteriorated in shape tends to lead to deterioration in its basic characteristic. Specifically, as the number of set/reset operations conducted on a memory cell increases, the variable resistance element in the memory cell gradually becomes hard to change its resistance value. If a variable resistance element deteriorates in shape, the maximum number of the set/reset operations that may be conducted on one memory cell may decrease.

On the other hand, in this embodiment, carbon nitride ($CN_x$) is formed on the side of the carbon-including thin film in the variable resistance element VR. Carbon nitride (CNx) has higher tolerance against the oxygen plasma ashing than carbon (C). Accordingly, even if the oxygen plasma ashing is performed thereon, deterioration in shape is restricted. Thus, electric characteristics of the variable resistance element VR can be stable.

A method of manufacturing memory cells MC comprising a variable resistance element VR formed of such a carbon thin film is described with reference to FIGS. 8 to 10.

Figure 8:
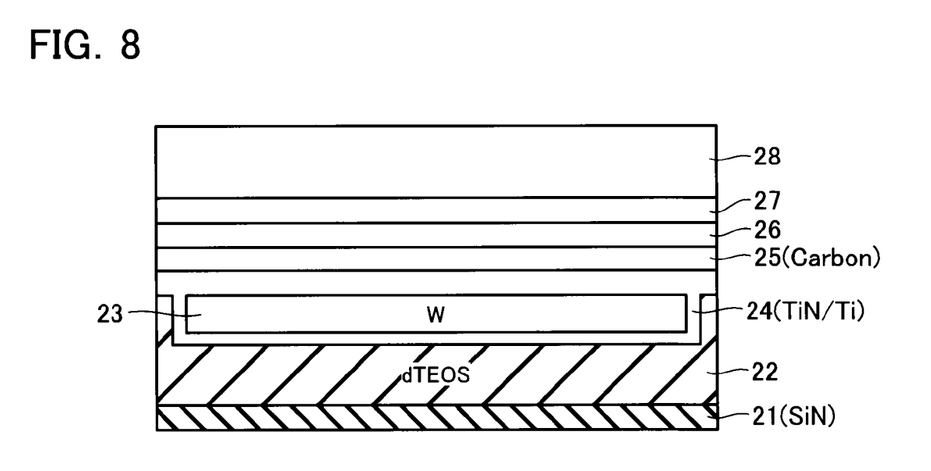
FIG. 8 is a process chart that explains a step for manufacturing a memory cell MC according to the embodiment of the present invention.

First, as shown in FIG. 8, after forming a silicon nitride film (SiN) 21 using a CVD method on a semiconductor substrate (not shown), a dTEOS film 22 is formed using a CVD method on the silicon nitride film 21. A trench is formed in this dTEOS film 22 for forming the word line WL therein. A compound film 24 as a laminated film of titanium nitride (TiN) and titanium (Ti) is formed in the trench. Furthermore, a metal film 23 such as tungsten (W) is formed thereon. This metal film 23 serves as the word line WL. In addition, the compound film 24 is further formed on this metal film 23.

Then, a carbon thin film 25, a compound film 26 of titanium nitride (TiN) and titanium (Ti), a silicon film 27 serving as the diode D1, and a metal film 28 formed of tungsten (W) or the like are laminated sequentially on the compound film 24. The metal film 28 serves as the bit line BL. The carbon thin film 25 serves as the variable resistance element VR, and may be deposited using a PECVD method, for example. The metal film 28 may be deposited using a sputtering method or the like.

Figure 9:
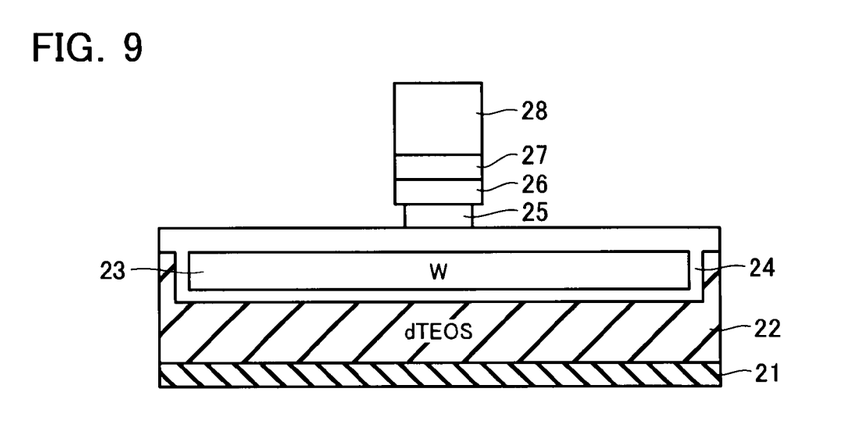
FIG. 9 is a process chart that explains a step for manufacturing a memory cell MC according to the embodiment of the present invention.
Figure 10:
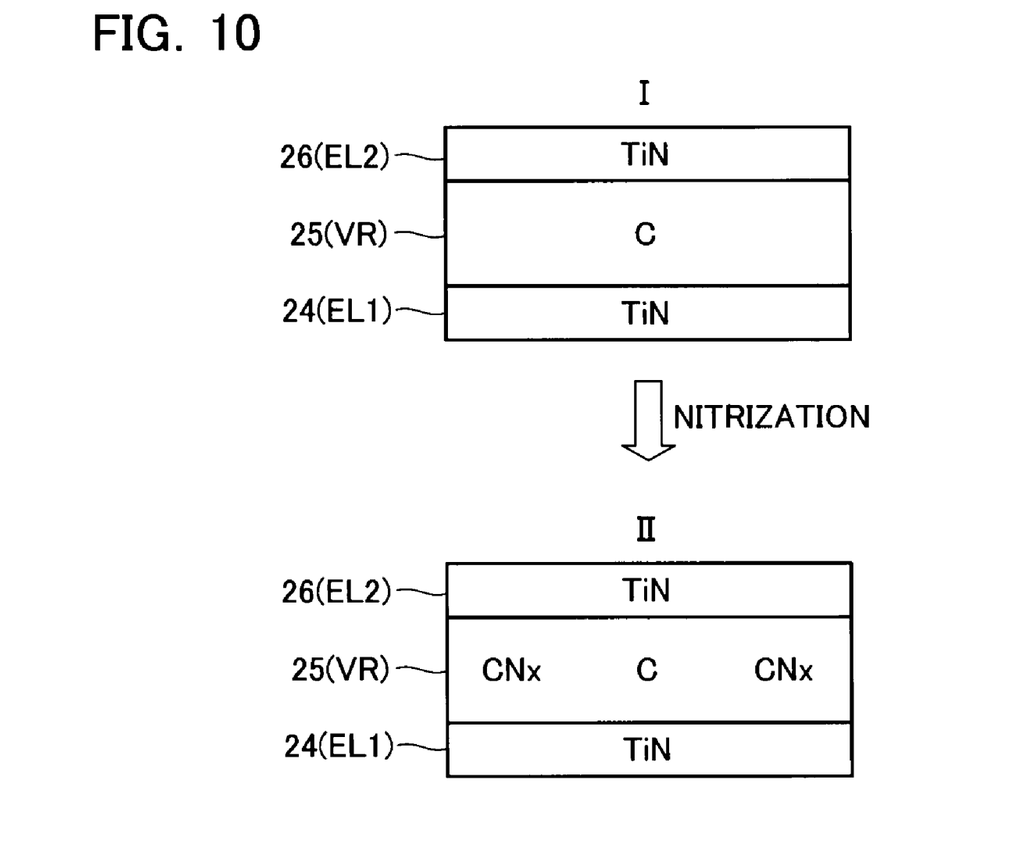
FIG. 10 is a process chart that explains a step for manufacturing a memory cell MC according to the embodiment of the present invention.

Thereafter, as shown in FIG. 9, after a resist is coated and cured on the top surface of the metal film 28, a reactive ion etching (RIE) with mixed gas of $CF_4$ and oxygen is performed using a mask of the resist film, thereby patterning the carbon thin film 25, the compound film 26, the silicon film 27 and the metal film 28. Then, as shown in FIG. 10, carbon (C) at the side surface of the carbon thin film 25 is changed to carbon nitride ($CN_x$) by nitrogen plasma.

In addition, ashing with oxidation plasma is performed to remove the resist film used for RIE. In this case, since the side surface of the carbon thin film 25 is already changed to carbon nitride ($CN_x$), it is hardly affected by the oxidation plasma, and the deterioration in shape at the side surface thereof does not occur.

In this way, since the side surface of the carbon thin film 25 included in the resistance variation element VR is changed to carbon nitride ($CN_x$), the carbon nitride ($CN_x$) prevents the carbon thin film 25 from being deteriorated in shape caused by ashing or the like. Specifically, it serves to stabilize the electric characteristic of the resistance variation element VR. Moreover, because carbon nitride ($CN_x$) is an insulator, a current does not flow therethrough (see FIG. 11). When the whole part of the variable resistance element VR is formed of a carbon thin film, a cell current flows through the whole part of the cross section of the variable resistance element VR. This may shrinks a current density thereof. A certain current density is needed for changing a resistance value of the variable resistance element VR. Accordingly, when the whole part of the variable resistance element VR is formed of a carbon thin film, it is necessary to provide a large current to the memory cell, leading to large power consumption.

Figure 11:
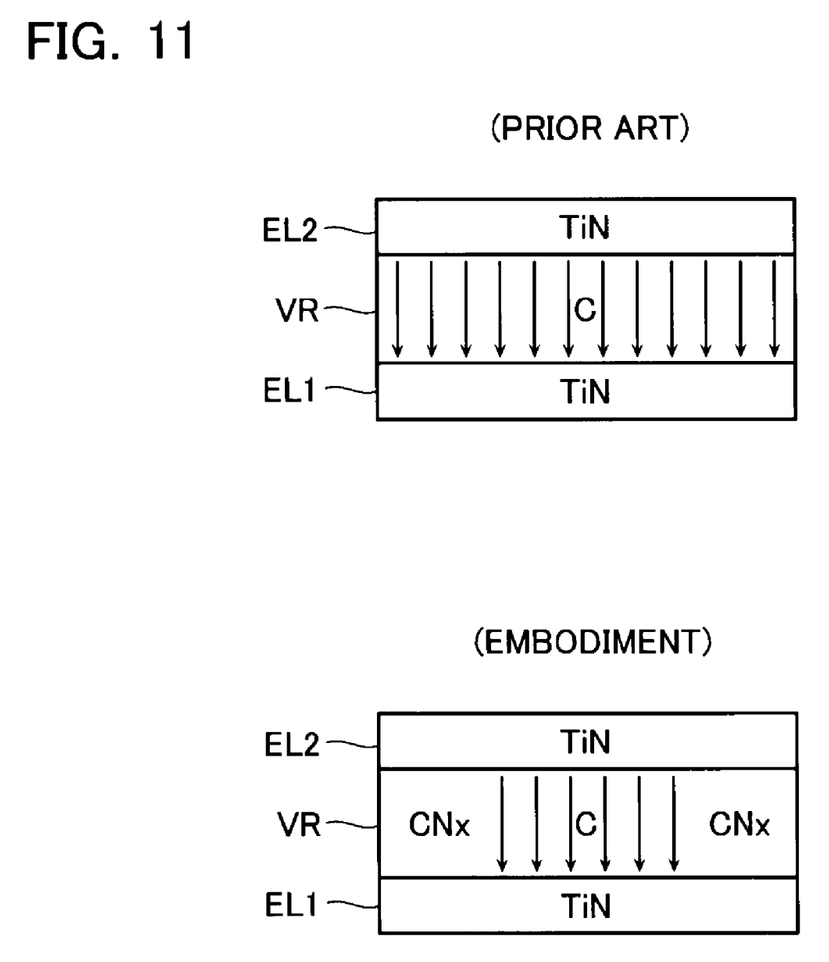
FIG. 11 explains an advantage when the structure of the variable resistance element VR according to the embodiment of the present invention is employed

In contrast, in this embodiment, the side surface of the variable resistance element VR is formed of carbon nitride (CNx) having a high resistivity. A current does not flow through the peripheral portion of the variable resistance element VR, but flows only through the central portion of the variable resistance element VR. Thus, a current density can be high at the central portion, and a resistance value of variable resistance element VR can be changed by a small current. This may lead to reduced power consumption.

Moreover, carbon nitride film formed on the side surface of the carbon thin film serves to prevent Joule heat caused by a reset operation or the like from being diffused to outside. This may allow a reset operation to be performed with a smaller current. In addition, this also suppresses heat interference to adjacent memory cells, thereby preventing a false reset operation. As a result, the miniaturization of memory cells can be achieved.

This concludes description of embodiments in accordance with the present invention, but it should be noted that the present invention is not limited to the above-described embodiments, and that various alterations, additions, and so on, are possible within a range not departing from the scope and spirit of the invention. For example, in the embodiment, a unipolar-type memory cell in which a variable resistance element and a diode is connected in series is explained by way of example. However, the present invention is not limited to this. The present invention may be applied to a bipolar-type memory cell comprising a variable resistance element with a carbon thin film and a transistor.

EXAMPLE

Although various examples are explained hereinbelow, these examples are not intended to limit the scope of the present invention.

Examples 1-6

Figure 12:
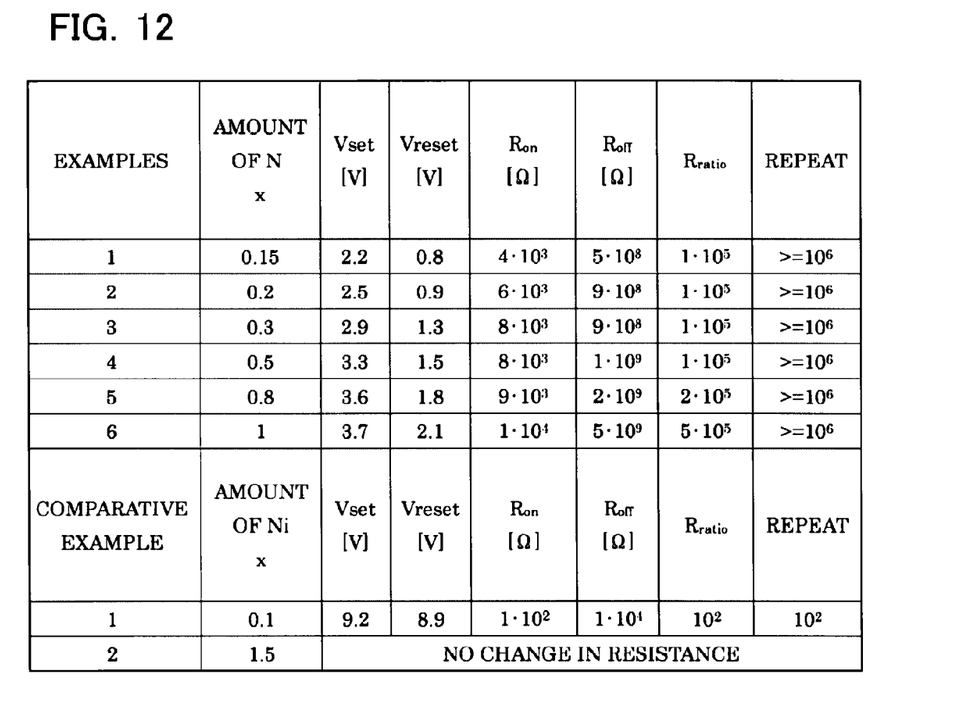
FIGS. 12-15 show examples and comparative examples of the present invention.

The memory cell MC shown in FIG. 3 was produced, changing a content rate of nitrogen at the side portion VR2 to various values. FIG. 12 illustrates a relationship between a value of a content rate of nitrogen [at. %] at the side portion VR2 divided by a content rate of carbon [at. %] at the side portions VR2 (this value is called "amount of nitrogen (N) x" hereinbelow), and the resistance variation characteristic of the memory cell MC. It is noted that in all of the examples explained hereinbeolow, the cross section of the memory cell MC has a circle shape with a diameter of 250 nm, a film thickness of carbon (C) being 10 nm. Also, titanium nitride (TiN) is used for electrodes formed above and below the variable resistance element VR.

Examples 1-6 are different in value of the amount of nitrogen x, respectively. FIG. 12 shows how resistance variation characteristics changes due to the difference in the amount of nitrogen x. The resistance-variation characteristics are expressed herein by the following factors:

a set voltage Vset (a voltage applied between the bit line BL and the word line WL at a set operation to change the memory cell MC from a high resistance state to a low resistance state);

a reset voltage Vreset (a voltage applied between the bit line EL and the word line WL at a reset operation to change the memory cell MC from a low resistance state to a high resistance state);

a resistance value Ron of the variable resistance element VR after the set operation;

a resistance value Roff of the variable resistance element VR after the reset operation; and a resistance ratio Rratio(=Roff/Ron) as a ratio of the above-described two resistance values.

The resistance-variation characteristic was measured by the following way. Specifically, voltage application operation is repeated for plural times, while measuring a resistance value between the electrodes EL1 and EL2, thereby mearuring the set voltage Vset, the reset voltage Vreset, the resistance Ron, and the resistance Roff. Note that the voltage applied between the electrodes EL1 and EL2 is a pluse voltage with a pulse width of 1 ms at the set operation, while it is a pulse voltage with a pulse width of 50 ns at the reset operation.

The polarity of the applied voltage is set such that the electrode EL2 is a cathode, while the electrode EL1 is an anode both in the set operation and in the reset operation.

It is confirmed that the memory cell MC in the examples 1 to 6 had a small set voltage Vset, and a small reset voltage Vreset. In addition, deterioration of the resistance ratio Rratio was small, even after repeating applying the voltage at least $10^6$ times or more. That is, it is confirmed that the semiconductor memory cell according to the present invention is superior in operation stability and reproducibility.

On the other hand, comparative example 1 includes a memory cell having a variable resistance element that comprises carbon only and does not include nitrogen. This comparative example has a higher set voltage Vset and a higher reset voltage Vreset in comparison with the examples 1-6. In addition, it has a poorer tolerance against repetition of voltage application. Specifically, the variable resistance element did not show a change in resistance after repeating voltage application by $10^2$ times. Moreover, in comparative example 2, a resistance value of the variable resistance element before the application of a voltage is very high, and did not show any change in resistance even after application of a voltage.

Examples 7-9

Figure 13:
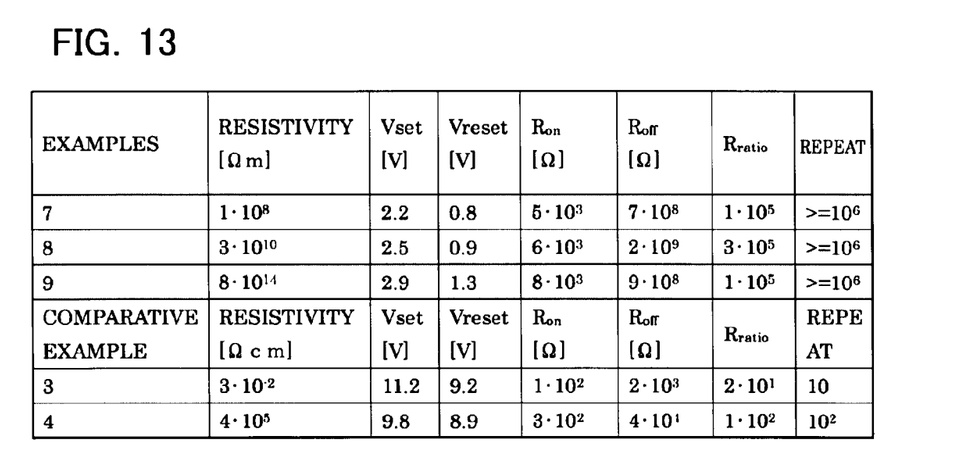

FIG. 13 shows examples 7-9 and their comparative examples 3 and 4. These examples 7-9 each has a different content rate of nitrogen at the side portions VR2. However, a content rate of nitrogen is not identified as a specific numerical value in each of the examples 7-9. Instead of this, a resistance value of the side portions VR2 is identified in each of the examples. FIG. 13 shows a difference in resistance variation characteristic of the memory cell MC among these examples 7-9 and the comparative example. These examples each has different resistivity at the side portion VR2 caused by a difference in nitrogen content rate.

It is confirmed that the memory cell MC in the examples 7 to 9 had a small set voltage Vset and a small reset voltage Vreset. In addition, deterioration of the resistance ratio Rratio was small, even after repeating applying the voltage at least $10^6$ times or more. That is, it is confirmed that the semiconductor memory cell according to the present invention is superior in operation stability and reproducibility.

On the other hand, the comparative examples 3 and 4 each has a small resistivity at the side portion VR2, and they require a large current and a high voltage for their operation. These comparative examples 3 and 4 have a higher set voltage Vset and a higher reset voltage Vreset in comparison with the examples 7-9. In addition, they have a poorer tolerance against repetition of voltage application. Specifically, the variable resistance element did not show a change in resistance after repeating voltage application by $10^2$ times.

Example 10-13

Figure 14:
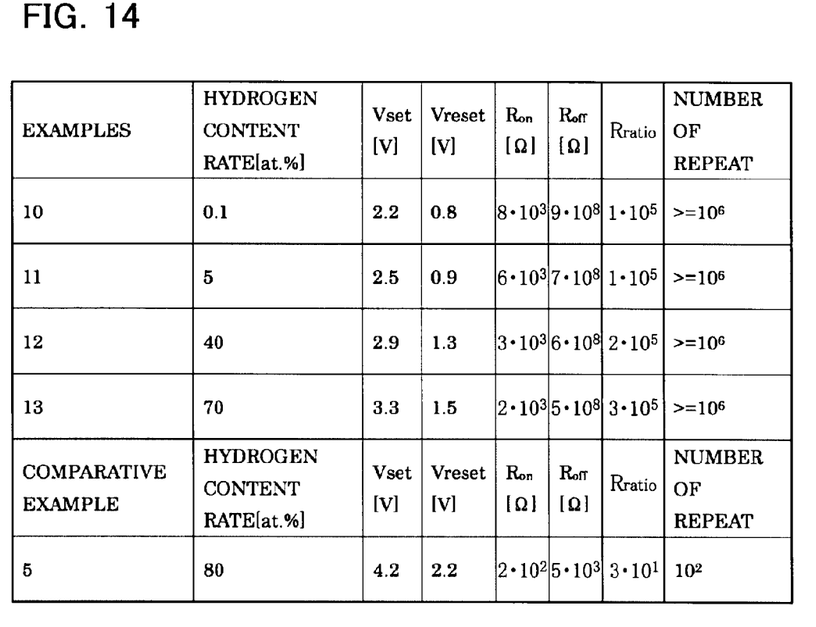

Examples 10-13 and their comparative example 5 is shown in FIG. 14. These examples 10-13 set the nitrogen content rate at the side portion VR2 at a certain range, while they have a different hydrogen content rate from one another.

That is, the side portion VR2 of these examples 10-13 includes hydrogen (H) as well as carbon nitride ($CN_x$) as chief ingredient. FIG. 14 shows relationship between the hydrogen content rate [at. %] at the side portion VR2 and the resistance variation characteristic of the memory cell MC. Examples 10-13 are different from one another in value of amount of hydrogen y. FIG. 14 shows how the resistance variation characteristic of memory cell MC changes caused by variation in amount of hydrogen y.

The memory cell of the examples 10-13 had a small set voltage Vset and a small reset voltage Vreset. In addition, deterioration of the resistance ratio Rratio was small, even after repeating applying the voltage at least $10^6$ times or more. That is, it is confirmed that the semiconductor memory cell according to the present invention is superior in operation stability and reproducibility.

On the other hand, the comparative examples 5 had a smaller resistance ratio Rratio. In addition, the variable resistance element did not show a change in resistance after repeating voltage application by $10^2$ times.

Example 14-19

Figure 15:
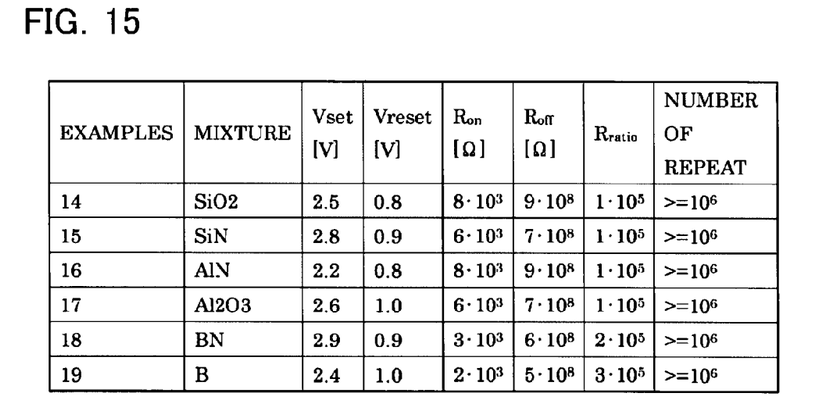

FIG. 15 illustrates example 14-19. These examples 14-19 set the nitrogen content rate at the side portion VR2 at a certain range, while they have another insulator other than carbon nitride ($CN_x$) at the side portion VR2 as a mixture. FIG. 15 shows relationship between the material of the insulator included in the side portion VR2 as a mixture and the resistance variation characteristic of the memory cell MC.

The memory cell of the examples 14-19 had a small set voltage Vset and a small reset voltage Vreset. In addition, deterioration of the resistance ratio Rratio was small, even after repeating applying the voltage at least $10^6$ times or more, similar to the aforementioned examples. That is, it is confirmed that the semiconductor memory cell according to the present invention is superior in operation stability and reproducibility.

What is claimed is:

1. A nonvolatile semiconductor memory device, comprising:
   a memory cell array including memory cells arranged therein, each of the memory cells being located at respective intersections between first wirings and second wirings and including a variable resistance element,
   the variable resistance element comprising a thin film including carbon (C),
   the thin film including a side surface along a direction of a current flowing in the memory cell, the side surface including carbon nitride ($CN_x$),
   wherein the variable resistance element further includes hydrogen (H).

2. The nonvolatile semiconductor memory device according to claim 1, wherein
   a content rate of carbon nitride ($CN_x$) in the side surface is a first value, and
   a content rate of carbon nitride ($CN_x$) in a center portion of the thin film is a second value that is smaller than the first value.

3. The nonvolatile semiconductor memory device according to claim 2, wherein
   a content rate of carbon nitride ($CN_x$) continuously and monotonically increases from the center portion of the thin film to the side surface.

4. The nonvolatile semiconductor memory device according to claim 3, further comprising a first metal electrode and a second metal electrode formed to sandwich the thin film.

5. The nonvolatile semiconductor memory device according to claim 2, wherein
   the variable resistance element has a first resistivity in a center portion thereof, and has a second resistivity higher than the first resistivity in a side surface thereof that is parallel to a direction of a current flowing in the memory cell.

6. The nonvolatile semiconductor memory device according to claim 5, wherein the first resistivity is $10^{-4}$ [$\Omega$m] or less, and the second resistivity is $10^8$ [$\Omega$m] or more.

7. The nonvolatile semiconductor memory device according to claim 5, further comprising a first metal electrode and a second metal electrode formed to sandwich the thin film.

8. The nonvolatile semiconductor memory device according to claim 5, wherein
   a content rate of carbon nitride ($CN_x$) continuously and monotonically increases from the center portion of the thin film to the side surface.

9. The nonvolatile semiconductor memory device according to claim 5, wherein
   the first and second resistivity are set at such values that a current flows only through the center portion and a current does not flow through the side surface.

10. The nonvolatile semiconductor memory device according to claim 1, wherein
the variable resistance element has a first resistivity in a center portion thereof, and has a second resistivity higher than the first resistivity in a side surface thereof that is parallel to a direction of a current flowing in the memory cell.

11. The nonvolatile semiconductor memory device according to claim 10, wherein
wherein the first resistivity is $10^{-4}$ [Ωm] or less, and the second resistivity is $10^{8}$ [Ωm] or more.

12. The nonvolatile semiconductor memory device according to claim 10, wherein
the first and second resistivity are set at such values that a current flows only through the center portion and a current does not flow through the side surface.

13. The nonvolatile semiconductor memory device according to claim 10, wherein further comprising a first metal electrode and a second metal electrode formed to sandwich the thin film.

14. The nonvolatile semiconductor memory device according to claim 1, further comprising a first metal electrode and a second metal electrode formed to sandwich the thin film.

15. The nonvolatile semiconductor memory device according to claim 1, wherein the side surface further includes, in addition to the carbon nitride ($CN_x$), other insulator material.

16. The nonvolatile semiconductor memory device according to claim 1, wherein the value of x is not less than 0.15.

17. The nonvolatile semiconductor memory device according to claim 1, wherein the value of x is not less than 0.2 and not more than 1.

* * * * *